(12) United States Patent
Pinarbasi

(10) Patent No.: US 7,440,242 B2
(45) Date of Patent: Oct. 21, 2008

(54) METHODS AND APPARATUS FOR IMPROVED READ SENSORS OF THE CPP TYPE USING A MULTI-LAYERED SEED LAYER STRUCTURE HAVING A NITROGENATED NICKEL-TANTALUM LAYER

(75) Inventor: Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/732,993

(22) Filed: Apr. 5, 2007

(65) Prior Publication Data

US 2007/0183099 A1 Aug. 9, 2007

Related U.S. Application Data

(63) Continuation-in-part of application No. 11/231,045, filed on Sep. 20, 2005, which is a continuation-in-part of application No. 10/881,062, filed on Jun. 30, 2004.

(51) Int. Cl.
*G11B 5/127* (2006.01)

(52) U.S. Cl. .............................. 360/324.12
(58) Field of Classification Search ............. 360/324.1, 360/324.12
See application file for complete search history.

(56) References Cited

U.S. PATENT DOCUMENTS

| 7,177,121 | B2 * | 2/2007 | Kojima et al. | 360/324.12 |
| 7,259,941 | B2 * | 8/2007 | Pinarbasi | 360/324.12 |
| 2006/0002041 | A1 * | 1/2006 | Pinarbasi | 360/324.12 |
| 2007/0091515 | A1 * | 4/2007 | Freitag et al. | 360/324.12 |

* cited by examiner

*Primary Examiner*—Angel Castro
(74) *Attorney, Agent, or Firm*—John J. Oskorep, Esq.; Rambod Nader

(57) ABSTRACT

A magnetic head with improved hard magnet properties includes a sensor stack structure of current-perpendicular-to-the-planes (CPP) type formed in a central region between first and second shield layers, and a multi-layered seed layer structure formed in side regions adjacent the central region. The multi-layered structure has a first layer including nitrogenated nickel-tantalum (NiTa+N) and a second layer including chromium-molybdenum (CrMo), which are formed over an insulator in the side regions. A hard bias layer formed over the multi-layered structure is preferably a cobalt-based alloy. Methods of making the magnetic head are also described.

26 Claims, 5 Drawing Sheets

METHODS AND APPARATUS FOR IMPROVED READ SENSORS OF THE CPP TYPE USING A MULTI-LAYERED SEED LAYER STRUCTURE HAVING A NITROGENATED NICKEL-TANTALUM LAYER

CROSS-REFERENCE TO RELATED APPLICATIONS

This application is a continuation-in-part of U.S. patent application Ser. No. 11/231,045 filed on 20 Sep. 2005 and entitled "Methods And Apparatus For Improved Read Sensors Using A Multi-Layered Seed Layer Structure Having A Nitrogenated Nickel-Tantalum Layer," which is a continuation-in-part of U.S. patent application Ser. No. 10/881,062 filed on 30 Jun. 2004 entitled "Methods And Apparatus For Improved Hard Magnet Properties In Magnetoresistive Read Heads Using A Multi-Layered Seed Layer Structure", which are hereby incorporated by reference herein.

BACKGROUND

1. Field of the Technology

This invention relates generally to magnetic read heads having read sensors for reading information signals from a magnetic medium, and more particularly to an improved seed layer structure for hard bias layers formed adjacent a read sensor of the current-perpendicular-to-the-planes (CPP) type.

2. Description of the Related Art

Computers often include auxiliary memory storage devices having media on which data can be written and from which data can be read for later use. A direct access storage device (disk drive) incorporating rotating magnetic disks are commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read (MR) sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer. A common type of MR sensor is the giant magnetoresistance (GMR) sensor which manifests the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers. GMR sensors using only two layers of ferromagnetic material (e.g., nickel-iron (NiFe), cobalt (Co), or nickel-iron-cobalt (NiFeCo)) separated by a layer of nonmagnetic material (e.g., copper (Cu)) are generally referred to as spin valve (SV) sensors manifesting the SV effect. In an SV sensor, one of the ferromagnetic layers, referred to as the pinned layer, has its magnetization typically pinned by exchange coupling with an antiferromagnetic (e.g., nickel-oxide (NiO), iridium-manganese (IrMn) or platinum-manganese (PtMn)) layer.

The magnetization of the other ferromagnetic layer, referred to as the free layer, however, is not fixed and is free to rotate in response to the field from the information recorded on the magnetic medium (the signal field). In the SV sensors, SV resistance varies as the cosine of the angle between the magnetization of the pinned layer and the magnetization of the free layer. Recorded data can be read from a magnetic medium because the external magnetic field from the recorded magnetic medium (the signal field) causes a change in direction of magnetization in the free layer, which in turn causes a change in resistance of the SV sensor and a corresponding change in the sensed current or voltage. In addition to the magnetoresistive material, the GMR sensor has conductive lead structures for connecting the GMR sensor to a sensing means and a sense current source. Typically, a constant current is sent through the GMR sensor through these leads and the voltage variations caused by the changing resistance are measured via these leads.

To illustrate, FIG. 1 shows a prior art SV sensor 100 ("read sensor 100") of the current-perpendicular-to-the-planes (CPP) type having side regions 104 and 106 separated by a central region 102. A free layer 110 is separated from a pinned layer 120 by a non-magnetic, electrically-conducting or insulating spacer 115. Spacer 115 may be made of electrically-conductive materials if sensor 100 is a GMR sensor, or alternatively, electrically-insulative materials if sensor 100 is a tunnel magnetoresistive (TMR) sensor. The magnetization of pinned layer 120 is fixed by an AFM pinning layer 121, which is formed on a shield layer 123 which may reside on a substrate (not shown in FIG. 1). Cap layer 108, free layer 110, spacer layer 115, pinned layer 120, and AFM pinning layer 121 are all formed in central region 102. Read sensor layers of read sensor 100 are generally sandwiched between shield layers 123 and 125, which together serve as a shield and as leads for the sensor.

Conventionally, hard bias layers 130 and 135 are formed in side regions 104 and 106 in order to stabilize free layer 110. These hard bias layers 130 and 135 are typically formed of a cobalt-based alloy which is sufficiently magnetized and perhaps shielded so that the magnetic fields of the media and/or the write head do not effect the magnetism of the hard magnets. Seed layers 150 and 155 are also deposited in side regions 104 and 106 underneath hard bias layers 130 and 135 to set a texture for the successful deposition of the hard magnets by promoting a desired c-axis in plane orientation. To perform effectively, hard bias layers 130 and 135 should have a high coercivity, a high MrT (magnetic remanence× thickness), and a high in-plane squareness on the magnetization curve. A preferred cobalt-based alloy for hard bias layers 130 and 135 is cobalt-platinum (CoPt) or cobalt-platinum-chromium (CoPtCr), while seed layers 150 and 155 typically comprise chromium (Cr) or other suitable metallic element.

Thus, as illustrated in FIG. 1, seed layers 150 and 155 and hard bias layers 130 and 135 are formed in side regions 104 and 106, respectively, and provide longitudinal bias for free layer 110. Cap layers 140 and 145 are formed over these hard bias layers 130 and 135, respectively, in the side regions 104 and 106. Seed layers 150 and 155 are formed over insulator layers 190 and 192, respectively, which are in turn formed directly over shield layer 123. Shield layers 123 and 125, which are "leads" of the sensor 100, provide electrical connections for the flow of the sensing current $I_s$ from a current source 160 to the sensor 100. In read sensors of the CPP type, sensing current $I_s$ is generally forced through the layers in central region 102 but not through side regions 104 and 106. Sensing means 170, which is connected to these leads, senses the change in the resistance due to changes induced in the free layer 110 by the external magnetic field (e.g. field generated by a data bit stored on a disk). One material for constructing these leads/shield layers 140 and 145 is a highly conductive material, such as a metal.

FIG. 2 shows a prior art read sensor 200 of the CPP type, similar to prior art read sensor 100 (FIG. 1), having side regions 204 and 206 separated by a central region 202. A free layer 210 is separated from a pinned layer 220 by a non-magnetic, electrically-conducting or insulating spacer 215. The magnetization of pinned layer 220 is fixed by an AFM pinning layer 221, which is formed on a shield layer 223 which may reside on a substrate (not shown in FIG. 2). Cap layer 208, free layer 210, spacer layer 215 and pinned layer 220 are all formed in central region 202. Unlike prior art read sensor 100 of FIG. 1, prior art read sensor 200 of FIG. 2 is a partial mill design with materials of AFM pinning layer 221 of sensor 200 extending into side regions 204 and 206. By "partial mill design", it is meant that the read sensor layers are not fully etched or milled in side regions 204 and 206 prior to the deposition of the seed, hard bias, and lead materials. A partial mill design may be desirable in order to better align free layer 210 with hard bias layers 230 and 235.

As illustrated in FIG. 2, seed layers 250 and 255 and hard bias layers 230 and 235 are formed in side regions 204 and 206, respectively. Hard bias layers 230 and 235 provide longitudinal biasing for free layer 210. Cap layers 240 and 245 are formed over these hard bias layers 230 and 235, respectively, in side regions 204 and 206. Seed layers 250 and 255 are formed over insulator layers 290 and 292, respectively, which are in turn formed directly over AFM pinning layer 221.

Similarly, as described earlier in FIG. 1, shield layers 223 and 225 which serve as "leads" of the sensor 200 provide electrical connections for the flow of the sensing current $I_s$ from a current source 260 to the sensor 200. Sensing current $I_s$ is generally forced through the layers in central region 202 but not through side regions 204 and 206. Sensing means 270, which is connected to these leads, senses the change in the resistance due to changes induced in the free layer 210 by the external magnetic field (e.g. field generated by a data bit stored on a disk).

Again, to perform effectively, hard bias layers of a CPP read sensor should have a high coercivity, a high MrT, and a high in-plane squareness on the magnetization curve. What are needed are methods and apparatus for improving hard magnet properties in read sensors of the CPP type.

SUMMARY

It has been discovered that improved hard magnetic properties are exhibited by hard bias layers when utilizing a multi-layered seed layer structure having a layer of nitrogenated nickel-tantalum (NiTa+N) and a layer of chromium (e.g. chromium-molybdenum (CrMo)) for a read sensor of the current-perpendicular-to-the-planes (CPP) type. Such hard bias layers exhibit increased coercivity and squareness of the hard magnets as compared to other prior art layer structures.

Specifically, a magnetic head having improved hard magnet properties includes a sensor stack structure of the CPP type formed in a central region in electrical contact with first and second shield layers, and a multi-layered layer structure formed in side regions adjacent the central region. A hard bias layer is formed over the multi-layered structure. The multi-layered structure includes a bottom layer comprising an insulator, a middle layer comprising nitrogenated nickel-tantalum (NiTa+N), and a top layer comprising CrMo. The hard bias layer may be made from a cobalt-based alloy, such as cobalt-platinum (CoPt) or cobalt-platinum-chromium (CoPtCr). A cap layer may be formed over the hard bias layer.

A hard disk drive may embody the magnetic head. This hard disk drive has at least one rotatable magnetic disk; a spindle supporting the at least one rotatable magnetic disk; a disk drive motor for rotating the at least one rotatable magnetic disk; a magnetic head for reading data from the at least one rotatable magnetic disk; and a slider for supporting the magnetic head. The magnetic head having improved hard magnet properties includes a read sensor formed in a central region in electrical contact with first and second shield layers which serve as leads for the read sensor, a multi-layered layer structure formed in side regions adjacent the central region, and a hard bias layer formed over the multi-layered seed layer structure. The multi-layered structure includes a bottom layer comprising an insulator, a middle layer comprising nitrogenated nickel-tantalum (NiTa+N), and a top layer comprising CrMo. A cap layer may be formed over the hard bias layer.

Finally, a method for use in forming a magnetic head includes forming a sensor stack structure of a read sensor in a central region over and in electrical contact with a first shield layer. A multi-layered layer structure is then formed in side regions adjacent the central region, and a hard bias layer is subsequently formed over the multi-layered structure. The multi-layered structure includes a bottom layer comprising an insulator, a middle layer comprising nitrogenated nickel-tantalum (NiTa+N), and a top layer comprising CrMo. The hard bias layer may be made from a cobalt-based alloy, such as cobalt-platinum (CoPt) or cobalt-platinum-chromium (CoPtCr). A cap layer may be formed over the hard bias layer.

BRIEF DESCRIPTION OF THE DRAWINGS

For a fuller understanding of the nature and advantages of the present disclosure, as well as the preferred mode of use, reference should be made to the following detailed description read in conjunction with the accompanying drawings.

DETAILED DESCRIPTION OF THE PREFERRED EMBODIMENTS

The following description is the best embodiment presently contemplated for carrying out the present invention. This description is made for the purpose of illustrating the general principles of the present invention and is not meant to limit the inventive concepts claimed herein.

Figure 1:
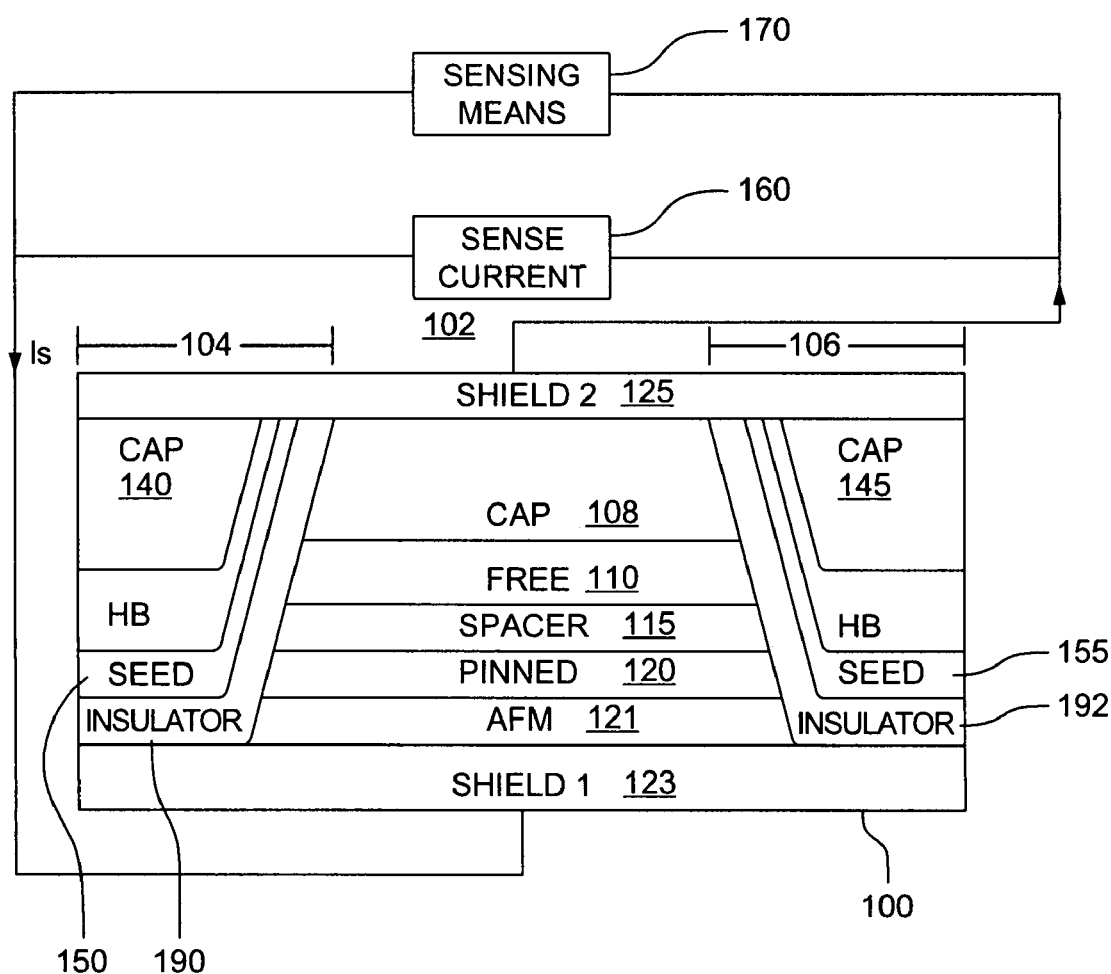
FIG. 1 is a schematic diagram of an air-bearing surface (ABS) view of the thin film structure of a prior art (spin valve) SV (or read) sensor device of the current-perpendicular-to-the-planes (CPP) type.
Figure 2:
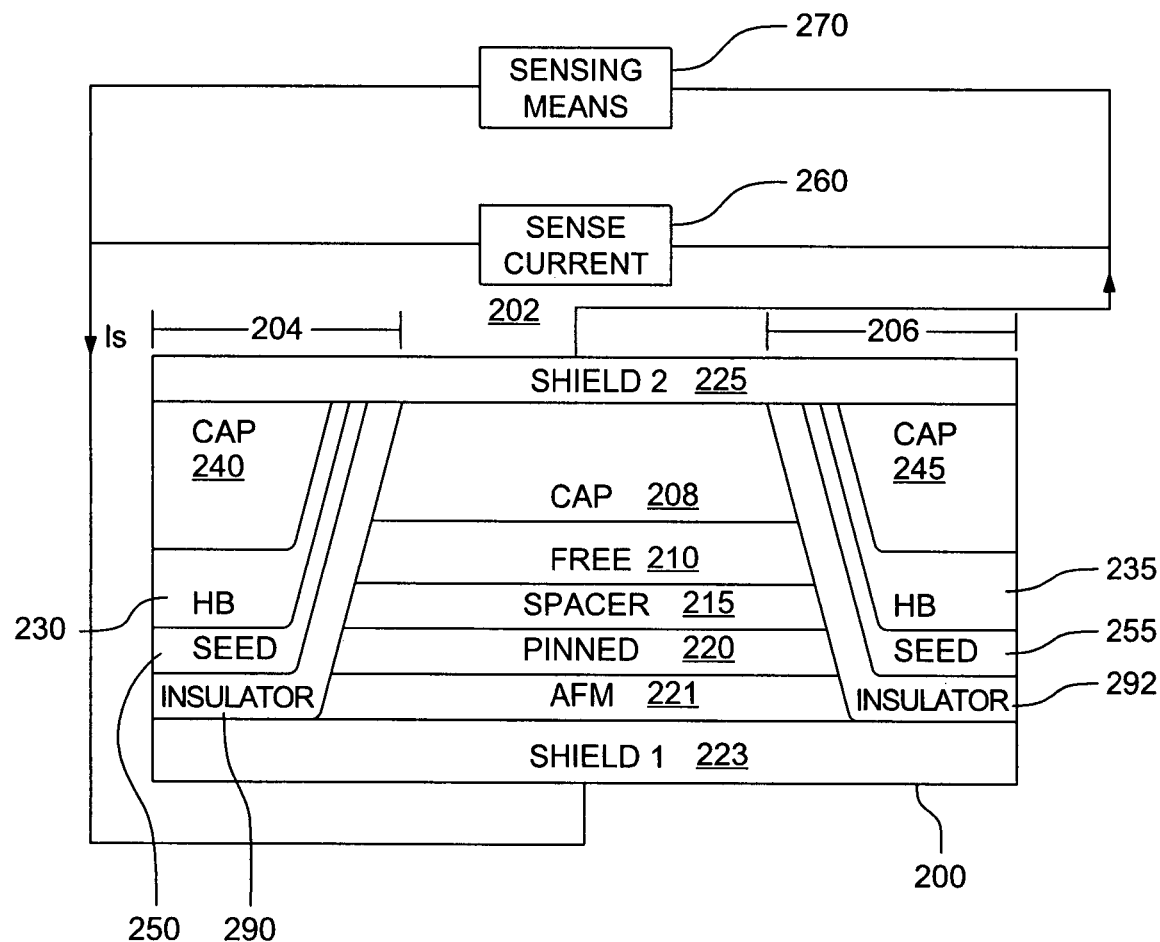
FIG. 2 is a schematic diagram of an air-bearing surface (ABS) view of the thin film structure of a partial mill prior art read sensor device of the CPP type.
Figure 3:
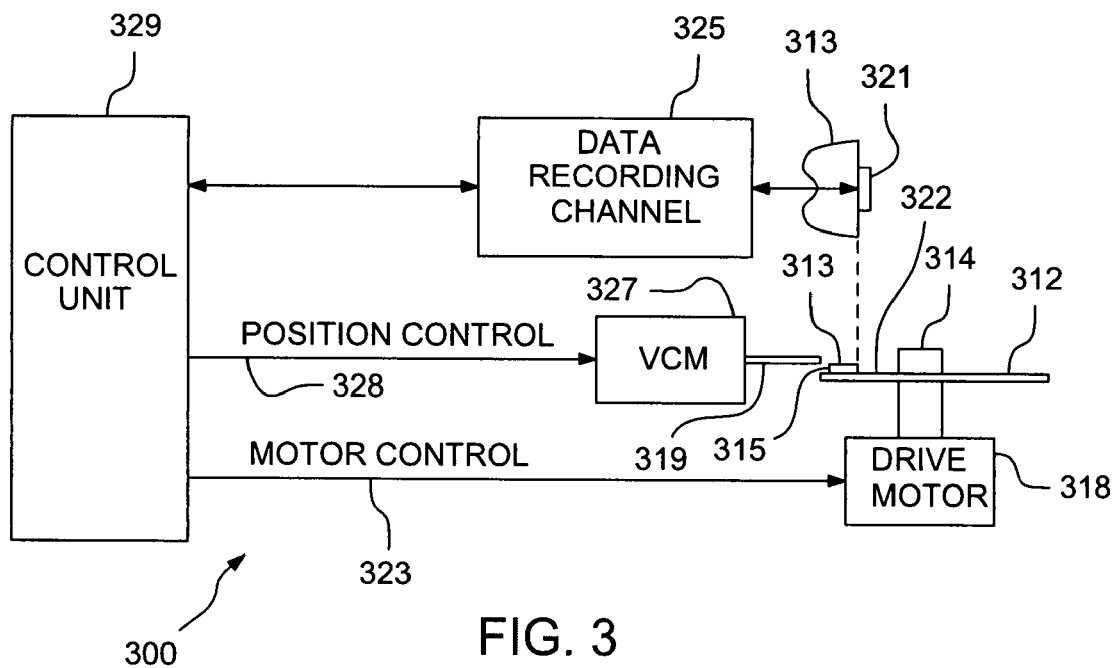
FIG. 3 is a block diagram of a magnetic recording disk drive system.

Referring to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting a magnetic read/write head 321 which incorporates the SV or read sensor of the present invention. As the disks rotate, slider 313 is moved radially in and out over disk surface 322 so that head 321 may access different portions of the disk where desired data is recorded. Each slider 313 is attached to an actuator arm 319 by means of a suspension 315. The suspension 315 provides a slight spring force which biases slider 313 against the disk surface 322. Each actuator arm 319 is attached to an actuator means 327. The actuator means as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 (the surface of slider 313 which includes head 321 and faces the surface of disk 312 is referred to as an air bearing surface (ABS)) and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write head 321 by means of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
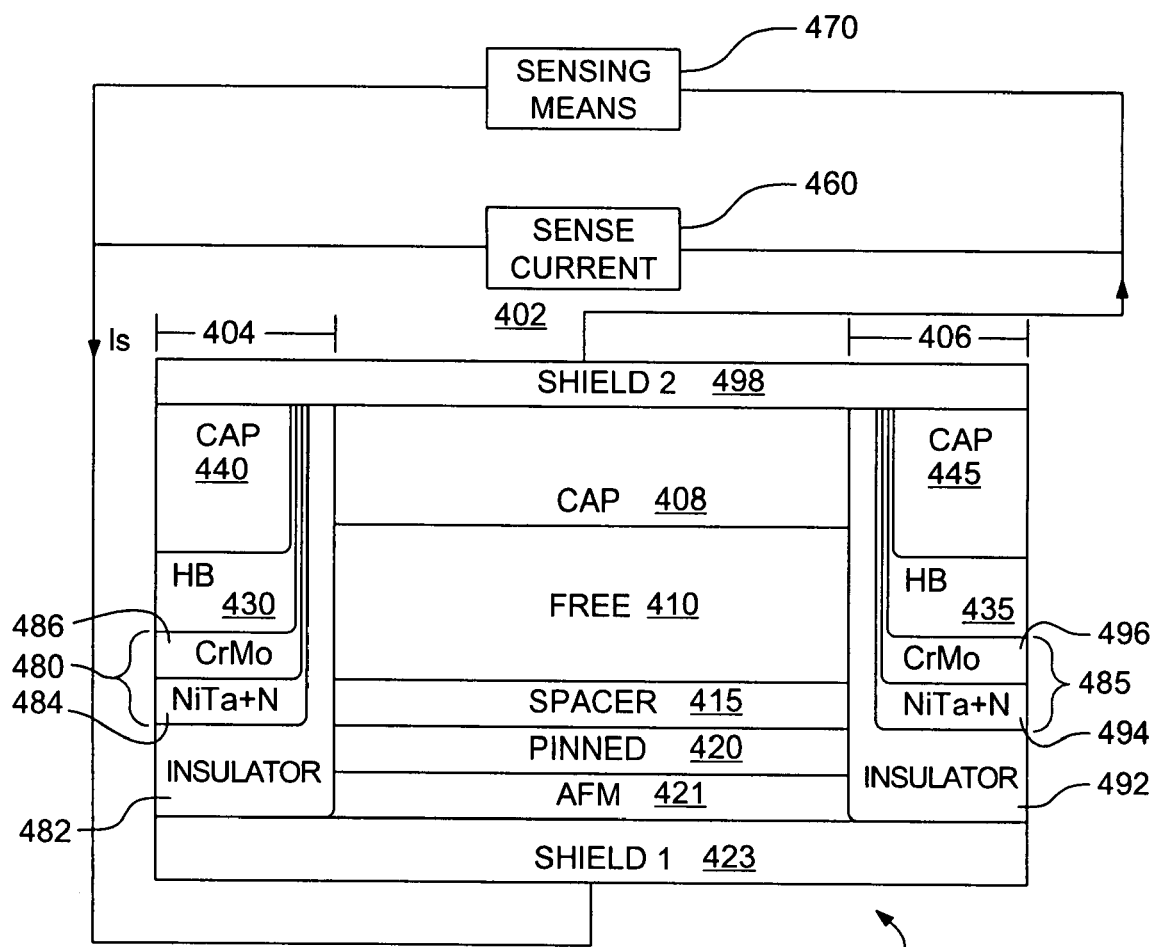
FIG. 4 is a schematic diagram of an ABS view of a thin film structure of a preferred embodiment read sensor of the CPP type according to the present disclosure.

FIG. 4 shows an air bearing surface (ABS) view of the read sensor 400 according to a preferred embodiment of the present disclosure. Read sensor 400 has side regions 404 and 406 separated by a central region 402. A sensing layer (free ferromagnetic layer) 410 is separated from a pinned layer (pinned ferromagnetic layer) 420 by a non-magnetic, electrically-conducting or insulating spacer layer 415. Spacer 415 may be made of electrically-conductive materials if sensor 400 is a GMR sensor, or alternatively, electrically-insulative materials if sensor 400 is a tunnel magnetoresistive (TMR) sensor. The magnetization of the pinned layer 420 is fixed by an antiferromagnetic (AFM) layer 421. Cap layer 408, sensing layer 410, spacer layer 415 and pinned layer 420 are all formed in central region 402 and form components of a sensor stack structure. Note that other sensor layer structure variations may be utilized.

Shield layers 423 and 498 serve as leads and provide electrical connections for the flow of the sensing current $I_s$ from a current source 460 to the read sensor 400. Sensing means 470, which is connected to these leads, senses the change in the resistance due to changes induced in the free layer 410 by the external magnetic field (e.g. field generated by a data bit stored on a disk).

In this embodiment, sensing layer 410 is formed of nickel-iron (NiFe) and cobalt-iron (CoFe), pinned layer 420 is formed of cobalt-iron (CoFe), and spacer layer 415 is formed of copper (Cu). Preferably, pinned layer 420 comprises a multi-layer film structure such as a first ferromagnetic layer/spacer/second ferromagnetic layer (e.g., cobalt-iron (CoFe)/ruthenium (Ru)/cobalt-iron (CoFe)) where the first and second ferromagnetic layers are antiferromagnetically coupled by a spacer layer. AFM layer may be formed of platinum-manganese (PtMn), iridium-manganese (IrMn), and nickel-oxide (NiO).

Hard bias layers 430 and 435 are formed in the side regions 404 and 406, respectively, and are in alignment with and provide longitudinal bias for free layer 410. Cap layers 440 and 445 are formed over these hard bias layers 430 and 435, respectively. Multi-layered seed layer structures 480 and 485, which in this embodiment are "bi-layered" seed layer structures, are also formed in side regions 404 and 406, respectively. More particularly, multi-layered structures 480 and 485 are formed below hard bias layers 430 and 435, respectively, adjacent the sensor stack structure and over insulator layers 482 and 492, respectively, in side regions 404 and 406. Insulator layers 482 and 492 are formed over and directly on first shield layer 423. Insulator layers 482 and 492 are made of electrically insulative materials and, preferably, made of alumina or atomic layer deposited (ALD) alumina.

According to the present disclosure, multi-layered structure 480 in side region 404 has a first layer 484 corresponding to a bottom layer of multi-layered structure 480 and a second layer 486 corresponding to a top layer of multi-layered structure 480. According to the present embodiment, first layer 484 is made of nitrogenated nickel-tantalum (NiTa+N) and second layer 486 is made of CrMo. Multi-layered structure 485 in side region 406 has the same material structure in first and second layers 494 and 496 as does multi-layered structure 480. Preferably, each first layer 484 has a thickness of between 3-100 Angstroms and each second layer 486 has a thickness of between 20-200 Angstroms. Advantageously, the hard bias materials exhibit an increased coercivity and squareness. For example, hard bias layer 430 may have a coercivity of 1400 Oersteds (Oe) or higher.

The techniques of the present disclosure involve depositing a NiTa layer of the multi-layered structure in a nitrogen atmosphere, and subsequently exposing the layer comprising nitrogenated nickel tantalum (NiTa+N) to oxygen. Through deposition of the NiTa in the nitrogen, the hard bias materials exhibit an increased coercivity and squareness.

Thus, the magnetic head of the present disclosure has a read sensor of the CPP type formed in central region 402 which is in electrical contact with first and second shield layers 423 and 498. The read sensor may be a GMR or TMR read sensor, for example. Multi-layered structures 480 and 485 are formed in side regions 404 and 406, respectively, adjacent the read sensor and upon insulator layers 482 and 492, respectively, which may be formed over first shield layer 423 and along sides of the read sensor. Hard bias layers 430 and 435 are formed over multi-layered seed layer structures 480 and 485 in side regions 404 and 406, respectively. Each one of multi-layered seed layer structures 480 and 485 includes first seed layer made of nitrogenated nickel-tantalum and second seed layer made of CrMo.

Figure 5:
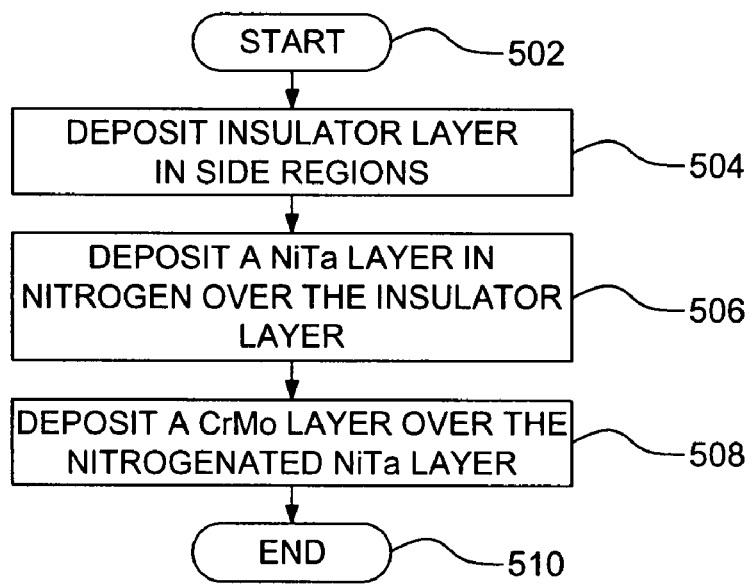
FIG. 5 is a flowchart describing a method of making a read sensor of the CPP type according to the present disclosure.
Figure 6:
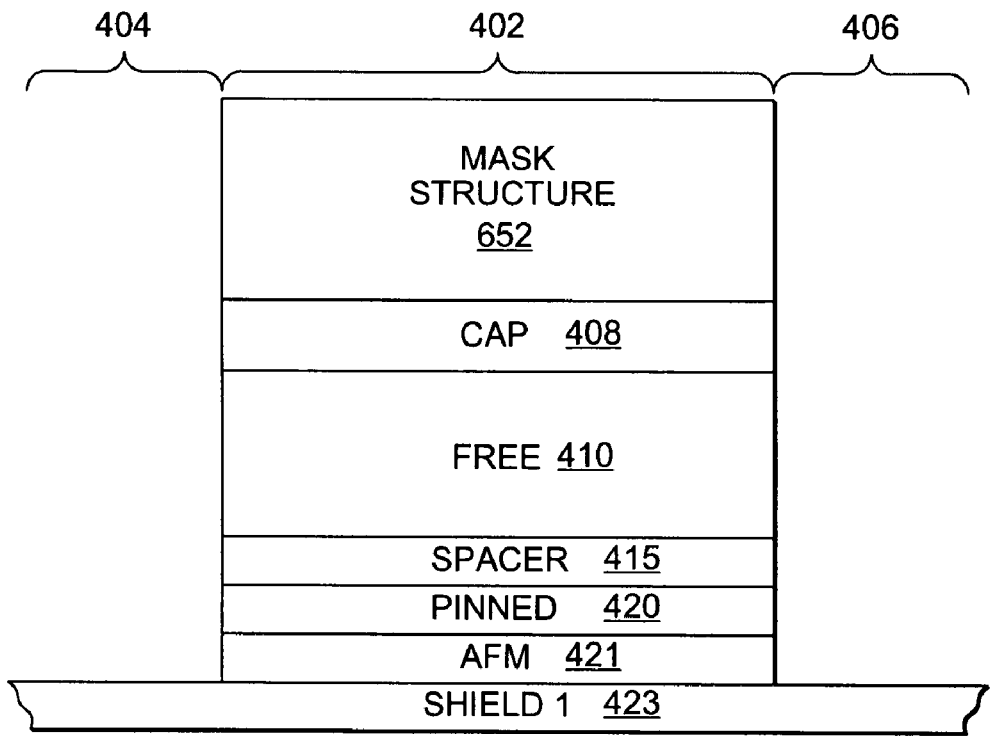
FIG. 6 shows a representative sensor stack structure of the present disclosure.

FIGS. 5-8 are illustrations relating to a preferred method of making the CPP-type read sensor of FIG. 4 according to the present disclosure. Referring first to FIG. 6, a partially-constructed multi-layered spin valve (SV) sensor stack structure 600 is shown, which illustrates the structure after the processing steps defining central region 402 of the sensor have been completed. To reach this stage of the processing in FIG. 6, the multi-layered read sensor structure may be deposited using known techniques in the art. A mask structure 652 is applied and patterned over multi-layered read sensor stack structure 600 in a central region 402. Mask structure 652 may, for example, be or include a resist such as a photoresist. However, non-resist materials in mask structure 652 may be utilized. Mask structure 652 is preferably formed so as to not have any undercuts, but rather straight sidewalls from top to bottom; that is, the mask structure sidewalls are substantially normal to a plane defined by the previously deposited read sensor layers. Although mask structure 652 may be a monolayer mask structure (e.g. a monolayer photoresist), it may alternatively be a multi-layered mask structure (e.g. bilayer or trilayer resist) which is formed without undercuts. Further alternatively, mask structure 652 may be structured so as to have undercuts (e.g. a bilayer resist having undercuts).

In any case, mask structure 652 is formed with a suitable width so as to define an appropriate trackwidth (TW) for the read sensor. Mask structure 652 masks the active region of the sensor during the ion beam milling and deposition process, for a multi-layered structure to be subsequently deposited in side regions 404 and 406. The layers formed under the mask have been protected during the ion milling process and remain intact. However, the portions of a pinned layer 420, a spacer layer 415, a sensing layer 410, and a capping layer 408 that are not protected by the mask during the ion milling process are removed in side regions 404 and 406 by the ion mill. The ion milling process may be stopped at any one of these layers.

Referring now back to FIG. 5, a flowchart which describes a method of forming a multi-layered structure for a read sensor of the CPP type is shown. The method of FIG. 5 may be utilized to form a multi-layered structure which includes a multi-layered seed layer structure 480 of FIG. 8. Beginning at a start block 502 of FIG. 5, in combination with the view of FIG. 7, insulator layers 482 and 492 are deposited in the side regions 404 and 406, respectively, over first shield layer 423 as well as along sides of the read sensor structure (step 504 of FIG. 5). Alternatively, for a partial-mill design, these insulator layers 482 and 492 may be formed over crystalline materials of the sensor stack structure. Insulator layers 482 and 492 are made of electrically-insulative materials, such as alumina ($Al_2O_3$) or atomic layer deposited (ALD) alumina.

Nickel-tantalum (NiTa) is then deposited in a nitrogen ($N_2$) atmosphere over insulator layers 482 and 492, to form layers 484 and 494 made of nitrogenated nickel-tantalum (NiTa+N) (step 506 of FIG. 5). In one embodiment, layers 484 and 494 made of nitrogenated nickel-tantalum are deposited to a thickness between about 3 to 100 Å, and preferably has a specific thickness of about 15 Å. The NiTa may be deposited in the nitrogen atmosphere with a nitrogen sputtering pressure of about $2.5 \times 10^{-5}$ Torr for a time range of about 15 to 60 seconds, say for about 30 seconds, for example.

Next, layers 486 and 496 made of CrMo are deposited over layers 484 and 494 made of nitrogenated nickel-tantalum, respectively (step 508 of FIG. 5). Preferably, layers 486 and 496 are deposited to a thickness between 20 to 200 Å, and preferably has a specific thickness of about 50 Å. Layers 486 and 496 serve as seed layers which promotes necessary c-axis in plane orientation for increased coercivity of subsequently deposited hard bias layers 430 and 435.

The flowchart ends at a finish block 510 of FIG. 5, but additional conventional processing steps may be performed, such as depositing hard bias layers 430 and 435 over layers 486 and 496 made of the CrMo, and cap layers 440 and 445 over hard bias layers 430 and 435, respectively. Preferably, hard bias layers 430 and 435 are layers of suitable hard magnetic material, such as cobalt-platinum-chromium (CoPtCr) or cobalt-platinum (CoPt). However, the hard magnet material may be any suitable cobalt-based alloy.

Advantageously, the deposition of NiTa in nitrogen atmosphere increases the squareness of the hard bias materials. By depositing the NiTa in the nitrogen atmosphere, the microstructure of the NiTa is changed, resulting in an amorphous microstructure. This leads to improved squareness of the hard bias material.

Figure 8:
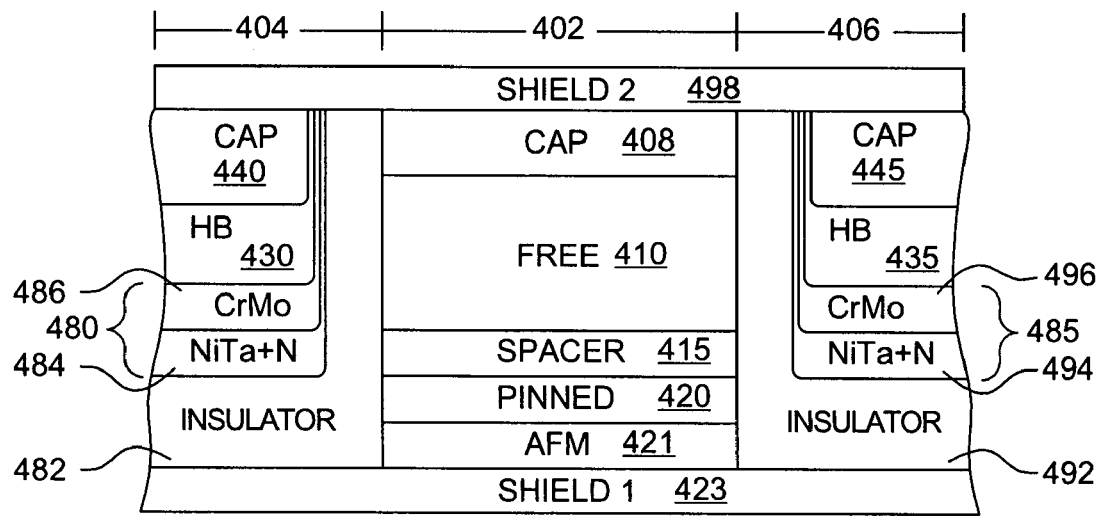
FIG. 8 shows the read sensor having the multi-layered structures according to the present disclosure.

A planarization process, such as a chemical-mechanical polishing (CMP), is then performed over the structure to remove mask structure 652 and form a top planar surface. Alternatively, if mask structure 652 is formed with undercuts (e.g. a bilayer mask with undercuts), the mask structure may be removed by utilizing a suitable solvent. The result is the read sensor structure of FIG. 8, which further shows second shield layer 498 formed over the top of the structure. As shown in FIG. 8, the read sensor has an active SV structure formed in central region 402, and cap layers 440 and 445 and hard bias layers 450 and 455 formed in side regions 404 and 406, respectively. Thin multi-layered seed layer structures 480 and 485 are formed below hard bias layers 430 and 435, respectively, in side regions 404 and 406.

Figure 7:
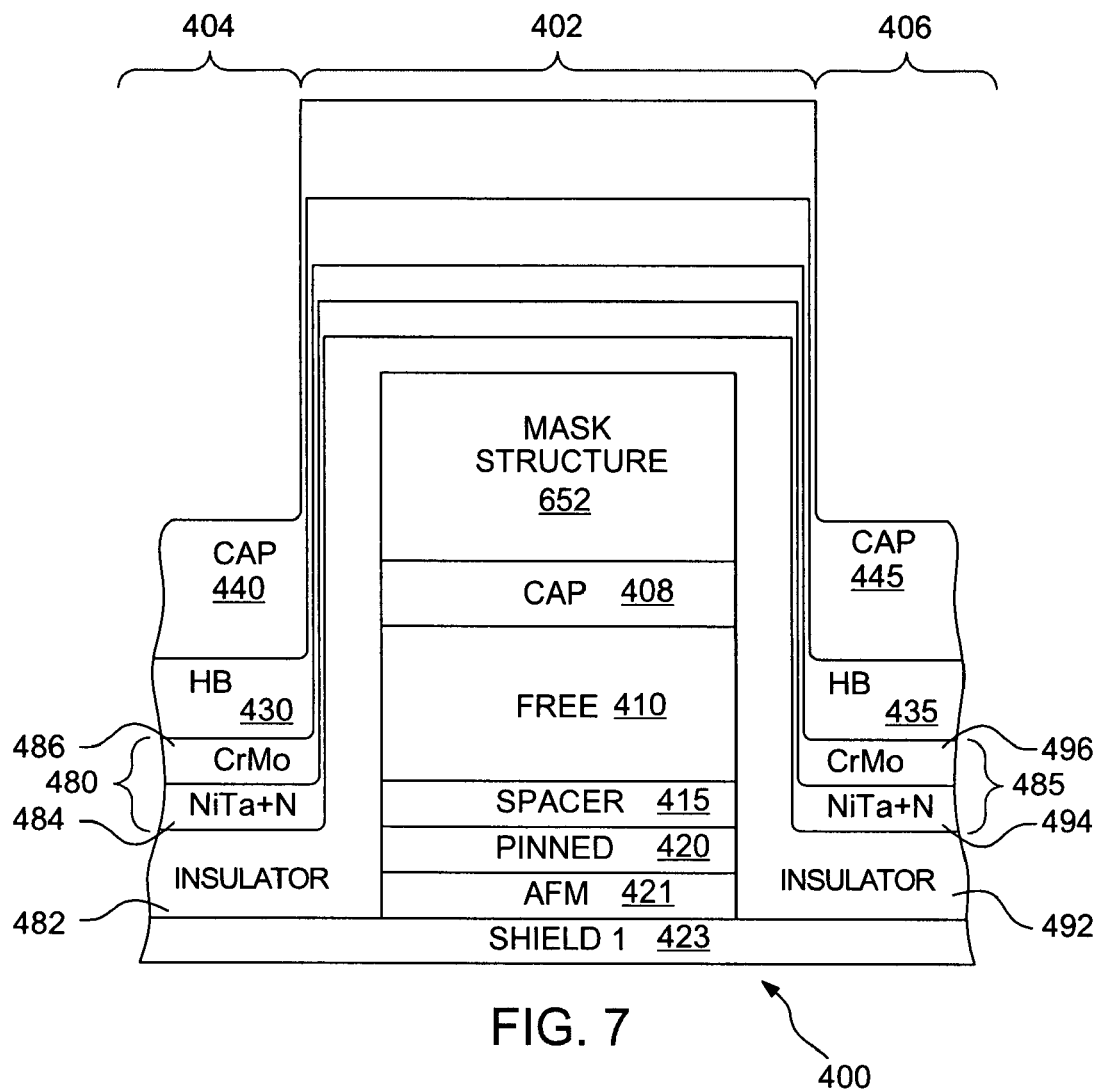
FIG. 7 shows a read sensor after the processing steps of depositing the multi-layered structures and hard biasing layers.

As described in relation to step 506 of FIG. 5 in combination with the view of FIG. 7, NiTa is deposited in a nitrogen atmosphere over insulator layers 482 and 492 to form layers 484 and 494 made of nitrogenated nickel-tantalum (NiTa+N). After this formation, layers 486 and 496 made of CrMo are deposited over layers 484 and 494. Alternatively, prior to the deposition of layers 486 and 496, top surfaces of layers 484 and 494 are oxidized, as described in the cross-referenced disclosure, to increase a coercivity and a squareness of the hard bias layer.

Advantageously, by utilizing multi-layered seed layer structures of the present disclosure in a CPP-type read sensor, the hard bias material exhibits improved properties compared to prior art seed layer structures.

It is to be understood that the above is merely a description of preferred embodiments of the invention and that various changes, alterations, and variations may be made without departing from the true spirit and scope of the invention as set for in the appended claims. For example, the sensor stack structure of the CPP type may be a giant magnetoresistive (GMR) sensor or a tunnel magnetoresistive (TMR) sensor. Few if any of the terms or phrases in the specification and claims have been given any special particular meaning different from the plain language meaning to those skilled in the art, and therefore the specification is not to be used to define terms in an unduly narrow sense.

What is claimed is:

1. A magnetic head, comprising:
   a sensor stack structure of a read sensor formed in a central region between first and the second shield layers which serve as leads for the read sensor;
   a multi-layered structure comprising:
      an insulator layer formed in side regions adjacent the central region;
      a layer comprising nitrogenated nickel-tantalum (NiTa+N) formed over the insulator layer; and
      a layer comprising chromium (Cr) formed over the layer comprising NiTa+N.

2. The magnetic head of claim 1, wherein the read sensor is of the current-perpendicular-to-the-planes (CPP) type.

3. The magnetic head of claim 1, further comprising:
wherein the insulator layer comprises a bottom layer of the multi-layered structure;
wherein the layer comprising NiTa+N further comprises a middle layer of the multi-layered structure; and
wherein the layer comprising Cr further comprises a top layer of the multi-layered structure.

4. The magnetic head of claim 1, wherein the layer comprising nitrogenated NiTa further comprises:
a layer comprising surface-oxidized NiTa+N.

5. The magnetic head of claim 1, further comprising a hard bias layer formed over the multi-layered structure.

6. The magnetic head of claim 1, wherein the multi-layered structure comprises a seed layer structure.

7. The magnetic head of claim 1, wherein the multi-layered structure is formed in side regions adjacent the sensor stack structure.

8. The magnetic head of claim 1, wherein the layer comprising chromium (Cr) comprises chromium-molybdenum (CrMo).

9. The magnetic head of claim 1, wherein the first and the second shield layers comprise at least one of magnetic materials and electrically conductive materials.

10. The magnetic head of claim 1, wherein the insulator layer comprises an atomic layer deposited (ALD) alumina.

11. The magnetic head of claim 1, further comprising:
a hard bias layer formed over the multi-layered structure; and
wherein the NiTa+N layer increases a coercivity and a squareness of the hard bias layer.

12. The magnetic head of claim 1, further comprising:
a hard bias layer formed over the multi-layered structure; and
wherein the hard bias layer is a cobalt-based alloy.

13. The magnetic head of claim 1, further comprising:
a hard bias layer formed over the multi-layered structure; and
a cap layer formed over the hard bias layer.

14. A hard disk drive, comprising:
at least one rotatable magnetic disk;
a spindle supporting the at least one rotatable magnetic disk;
a disk drive motor for rotating the at least one rotatable magnetic disk;
a magnetic head for reading data from the at least one rotatable magnetic disk;
a slider for supporting the magnetic head;
the magnetic head, comprising:
a sensor stack structure of a read sensor formed in a central region between first and second shield layers which serves as leads for the read sensor;
a multi-layered structure formed in side regions adjacent the central region;
the multi-layered structure comprising:
an insulator layer;
a layer comprising nitrogenated nickel-tantalum (NiTa+N) formed over the insulator layer; and
a layer comprising chromium (Cr) formed over the layer comprising NiTa+N.

15. The hard disk drive of claim 14, wherein the read sensor is of the current-perpendicular-to-the-planes (CPP) type.

16. The hard disk drive of claim 14, further comprising:
wherein the insulator layer comprises a bottom layer of the multi-layered structure;
wherein the layer comprising NiTa+N further comprises a middle layer of the multi-layered structure; and
wherein the layer comprising Cr further comprises a top layer of the multi-layered structure.

17. The hard disk drive of claim 14, wherein the layer comprising NiTa+N further comprises:
a layer comprising surface-oxidized NiTa+N.

18. The hard disk drive of claim 14, further comprising a hard bias layer formed over the multi-layered structure.

19. The hard disk drive of claim 14, wherein the multi-layered structure comprises a seed layer structure.

20. The hard disk drive of claim 14, wherein the multi-layered structure is formed in side regions adjacent the sensor stack structure.

21. The hard disk drive of claim 14, wherein the layer comprising Cr comprises chromium-molybdenum (CrMo).

22. The hard disk drive of claim 14, wherein the first and the second shield layers comprise at least one of magnetic materials and electrically conductive materials.

23. The hard disk drive of claim 14, further comprising:
a hard bias layer formed over the multi-layered structure; and
the hard bias layer being in alignment with a free layer structure of the sensor stack structure.

24. The hard disk drive of claim 14, further comprising:
a hard bias layer formed over the multi-layered structure; and
wherein the layer comprising NiTa+N increases a coercivity and a squareness of the hard bias layer.

25. The hard disk drive of claim 14, further comprising:
a hard bias layer formed over the multi-layered structure; and
wherein the hard bias layer is a cobalt-based alloy.

26. The hard disk drive of claim 14, further comprising:
a hard bias layer formed over the multi-layered structure; and
a cap layer formed over the hard bias layer.

* * * * *